United States Patent
Blashewski et al.

(10) Patent No.: US 6,769,133 B1
(45) Date of Patent: *Jul. 27, 2004

(54) TERMINATION CIRCUITRY FOR DUAL FORWARD AND REVERSE TEST POINTS FOR AMPLIFIERS

(75) Inventors: Steven E. Blashewski, Duluth, GA (US); John W. Brickell, Lawrenceville, GA (US)

(73) Assignee: Scientific-Atlanta, Inc., Lawrenceville, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/416,694

(22) Filed: Oct. 12, 1999

Related U.S. Application Data

(63) Continuation-in-part of application No. 09/170,866, filed on Oct. 13, 1998.

(51) Int. Cl.[7] .............................................. H04N 7/173
(52) U.S. Cl. ....................... 725/128; 348/180; 348/181; 348/192; 348/193; 346/12; 346/13; 455/67.11; 455/423; 455/249.1; 725/107; 725/128
(58) Field of Search ............................ 455/67.11, 423, 455/249.1; 324/76.11, 616; 346/12, 13; 348/180, 181, 192, 193; 725/107, 117, 127, 128, 147

(56) References Cited

U.S. PATENT DOCUMENTS 5,656,978 A * 8/1997 Bianu et al. ............... 333/81 R
6,198,498 B1 * 3/2001 Brickell ....................... 725/128

FOREIGN PATENT DOCUMENTS

WO    WO 97/47103    * 12/1997
WO    WO 00/22836    * 4/2000    .......... H04N/17/00

* cited by examiner

Primary Examiner—Andrew Faile
Assistant Examiner—Ngoc Vu
(74) Attorney, Agent, or Firm—Kenneth M. Massaroni; Hubert J. Barnhardt, III; Shelley L. Couturier

(57) ABSTRACT

A communication system (100) processes forward signals generated by headend equipment (105) and reverse signals generated by subscriber equipment (135). A communication medium (110, 120), such as fiber optic cable or coaxial cable, connects the headend equipment (105) and the subscriber equipment (135), and amplifiers (400) are positioned at various locations along the medium (110, 120) to amplify the forward and reverse signals. The amplifiers (400) include a dual forward/reverse test circuit (FIG. 6) having a forward test point (406) coupled to the forward signal, a reverse test point (408) coupled to the reverse signal, and a single directional coupler (404) connected to the forward test point (406), for providing the forward signal thereto, and to the reverse test point (408), for providing the reverse signal thereto.

12 Claims, 4 Drawing Sheets

US 6,769,133 B1

TERMINATION CIRCUITRY FOR DUAL FORWARD AND REVERSE TEST POINTS FOR AMPLIFIERS

RELATED PATENT APPLICATIONS

This patent application is a continuation-in-part of U.S. patent application Ser. No. 09/170,866 to Brickell, which was filed on Oct. 13, 1998 and which is assigned to the assignee hereof.

FIELD OF THE INVENTION

This invention relates generally to amplifiers, and more specifically to test points within amplifiers.

BACKGROUND OF THE INVENTION

Communication systems, such as two-way cable television systems, typically process signals in both the forward, or downstream, direction and the reverse, or upstream, direction. These signals may travel long distances and, as a result, distribution amplifiers are typically employed to amplify the levels of the forward and reverse signals.

Within these distribution amplifiers, and within other electronic devices that process broadband distributed signals, it is desirable to provide test points coupled to the forward and reverse signal paths so that a technician can access these test points to analyze the nature, extent, and location of system problems or failures. Generally, within amplifiers, separate test points for the forward signal are provided prior and subsequent to forward signal amplification. Separate test points for the reverse signals are also provided prior and subsequent to reverse signal amplification. Therefore, within a single amplifier, four different test point locations are desired. Since each test point traditionally requires a separate directional coupler to pull off a portion of the signal to be tested, the multiplicity of test points within a single amplifier increases both the cost and the size of the device.

Thus, what is needed is an inexpensive and space-saving way to provide multiple test points within electronic devices in a communication system.

DETAILED DESCRIPTION OF A PREFERRED EMBODIMENT

Figure 1:
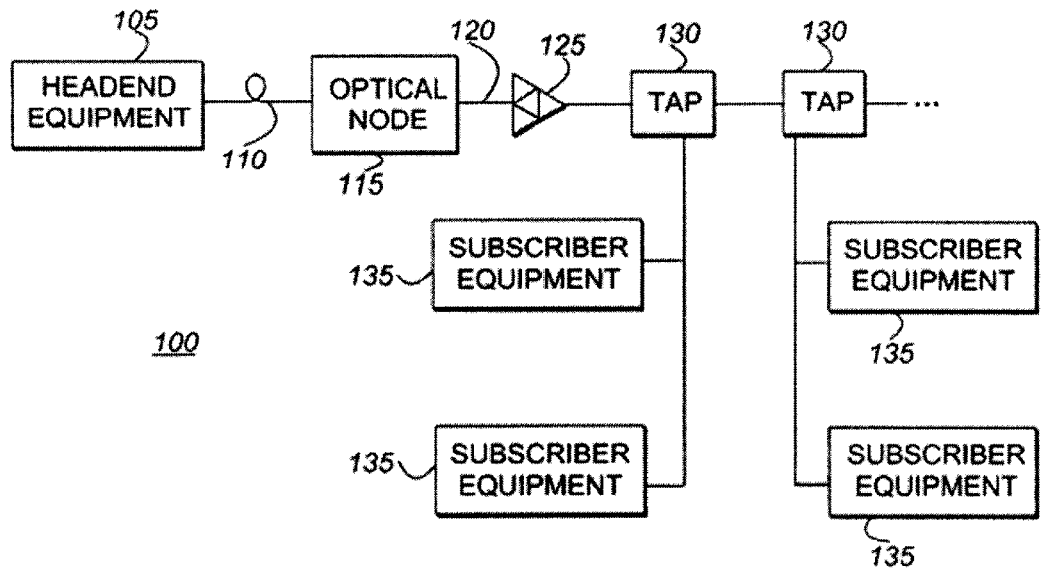
FIG. 1 is a block diagram of a conventional communication system.

A conventional two-way communication system 100, such as a cable television system, is depicted in FIG. 1, which shows headend equipment 105 for generating forward signals that are transmitted in the downstream direction along a communication medium, such as fiber optic cable 110, to an optical node 115 that converts optical signals to radio frequency (RF) signals. The RF signals are further transmitted along another communication medium, such as coaxial cable 120, and are amplified, as necessary, by distribution amplifiers 125 positioned along the communication medium. Taps 130 included in the cable television system 105 split off portions of the forward signals for provision to subscriber equipment 135, such as set top terminals, computers, and televisions. In a two-way system, the subscriber equipment 135 can also generate reverse signals that are transmitted upstream, amplified by distribution amplifiers 125, converted to optical signals at the optical node, and provided to the headend equipment 105 via a communication medium.

Figure 2:
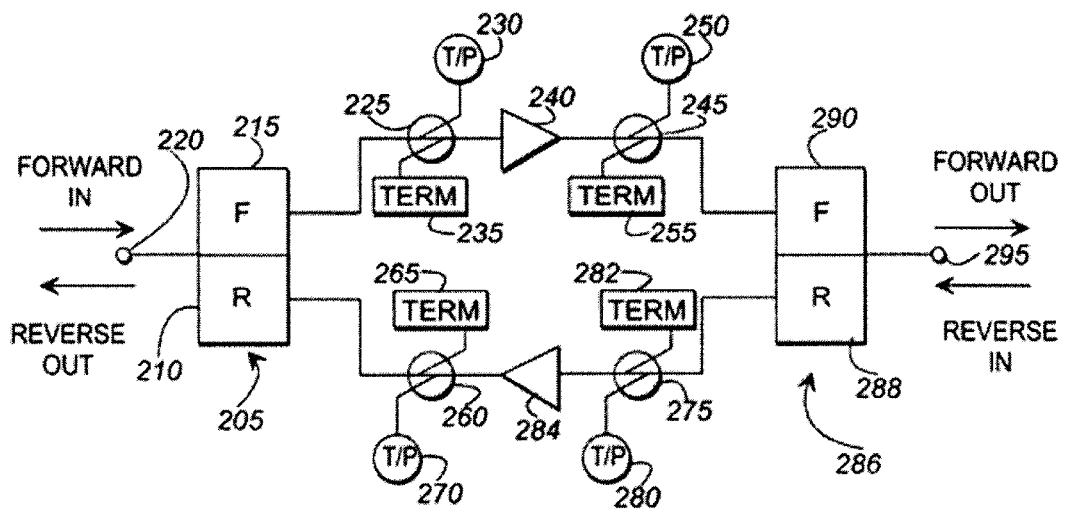
FIG. 2 is an electrical block diagram of a conventional test point circuit arrangement for use in an amplifier of the conventional communication system of FIG. 1.

Referring next to FIG. 2, an electrical block diagram of an amplifier 125 is depicted. The amplifier 125 includes a first port 220 for receiving forward signals and for outputting amplified reverse signals. A second port 295 outputs amplified forward signals and receives reverse signals from subscriber equipment 135. Coupled to the first port 220 is a diplex filter 205 including both forward and reverse sections 210, 215. The forward filter 215 blocks the reverse signals and passes the forward signals to a gain stage 240, where the forward signals are amplified. The amplified forward signals continue along the forward electrical path to the forward section 290 of another diplex filter 286. The amplified forward signals are passed by the forward section 290 of the second diplex filter 286 to the second port 295, which is coupled to a communication medium for distributing the amplified forward signal through the communication system.

The second port 295 also receives reverse signals, which are provided to the diplex filter 286. The diplex filter 286, via reverse section 288, blocks the forward signals and passes the reverse signals along the reverse electrical path to a reverse gain stage 284. After amplification, the reverse signals are provided to the first port 220 by the reverse section 210 of diplex filter 205.

As mentioned briefly in the Background of the Invention, it is desirable to provide various test points within the communication system 100 (FIG. 1) to pinpoint problems within that system. In particular, devices, such as an amplifier 125, that process forward and reverse signals typically include test points both before and after their gain stages so that the location of a problem or failed device can be narrowed down within the system 100. This is conventionally done by using a directional coupler to split off a portion of the signal to be tested. Since the use of directional couplers introduces loss into the signal path, forward test points 230, 250 have typically been located on the forward side of the diplex filters 205 so that only the forward signal is affected by the loss of the forward test point directional coupler. Similarly, reverse test points 270, 280 have typically been located on the reverse side of the diplex filters 286 so that only the reverse signal is affected by the loss of the reverse test point directional coupler.

Specifically, in amplifier 125, a first forward test point 230 is provided after the forward section 215 of diplex filter 205 and before the forward gain stage 240, and a second forward test point 250 is provided after the forward gain stage 240 and before the forward section 290 of diplex filter 286. A first reverse test point 280 is provided after the reverse section 288 of diplex filter 286 and before the reverse gain stage 284, and a second reverse test point 270 is provided after the reverse gain stage 284 and before the reverse section 210 of diplex filter 205. For each test point, a single directional coupler 225, 245, 260, 275 is used to couple the signal to be tested to the test point, with the other coupled leg terminated into a conventional resistor network via terminations 235, 255, 265, 282.

As can be seen from the amplifier 125 of FIG. 2, each test point has, in the prior art, required a dedicated directional coupler, other points of which are terminated in a known manner. As a result, a relatively large amount of space can be consumed by test point circuitry, and each additional test point requires the purchase and assembly of additional components.

Figure 3:
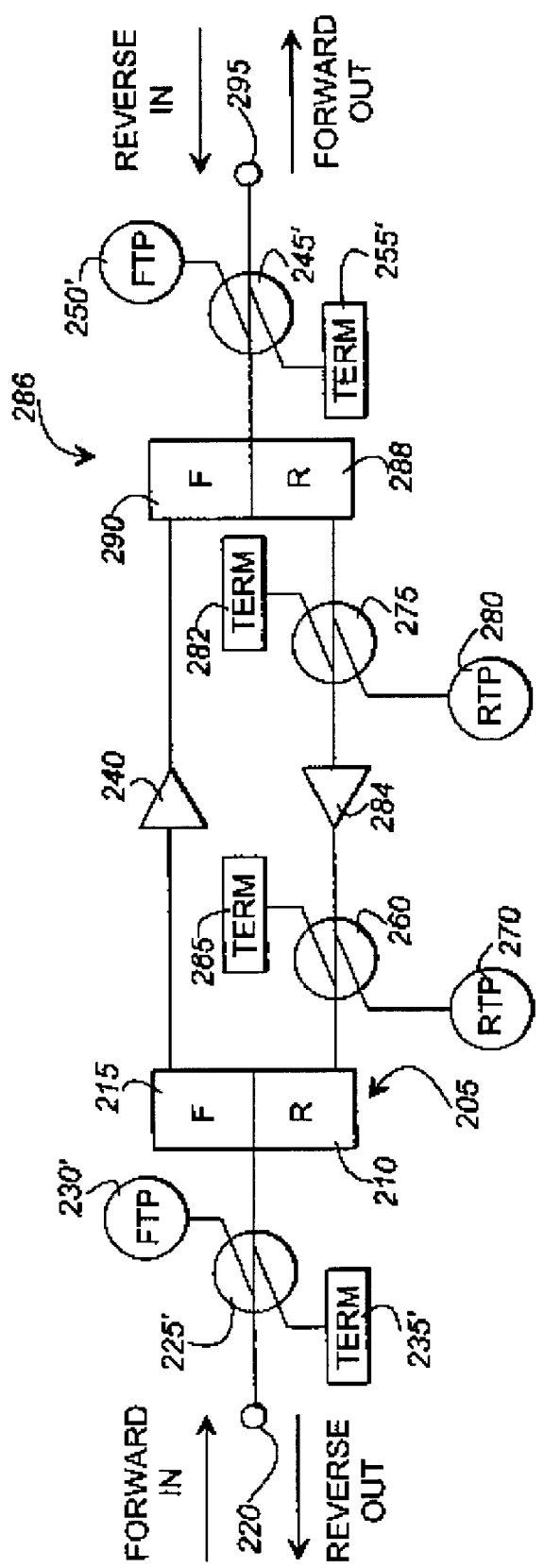
FIG. 3 is an electrical block diagram of another conventional test point circuit arrangement for use in an amplifier of the conventional communication system of FIG. 1.

FIG. 3 shows an alternative placement of test point circuitry in a conventional amplifier 125'. In this arrangement, the reverse test points 270, 280 are located as in FIG. 2. However, the forward test points 230', 250' are located on the port sides, i.e., the external sides, of the diplex filters 205, 286. The forward test points 230', 250' are still each provided by a single directional coupler 225', 245', the other coupled ports of which are terminated with known termination circuits 235', 255'. This test point location permits the injection of a reverse signal into the forward test point, thereby easing setup of the reverse signal path in the amplifier 125'. The reverse injected signal can be sent in the reverse band upstream to the headend equipment 105 (FIG. 1), where a picture of the reverse spectrum can be taken. The picture is then modulated on a forward band carrier and sent back in the forward, or downstream, path. The picture can then be read from the same forward test point in order to balance the reverse path of the amplifier 125'.

The problem with the test point arrangement of FIG. 3 is that additional loss is realized in the amplifier reverse path, since the forward test points 230', 250' have been moved to the port sides of the diplex filters 205, 286. This loss is due to the insertion loss of the forward test point directional couplers 225', 245', which are now a part of the reverse path. As a result, the reverse path gain, noise figure, and distortion of the distribution amplifier 125' can be negatively affected.

Figure 4:
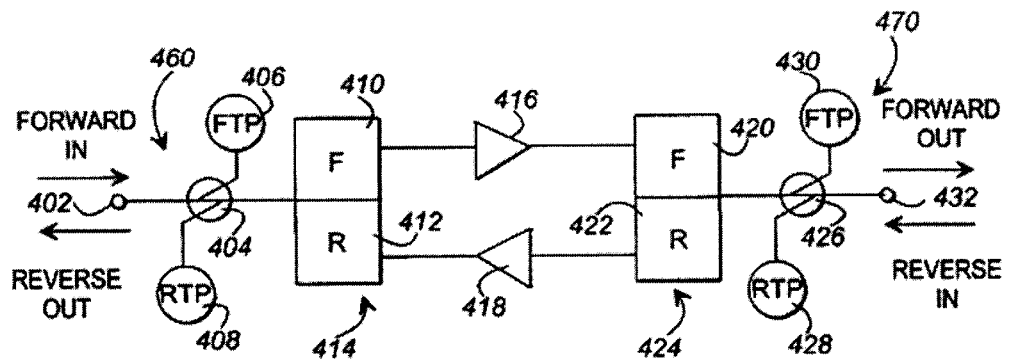
FIG. 4 is an electrical block diagram of a test point circuit arrangement for use in an amplifier according to the present invention.

Referring next to FIG. 4, an amplifier 400 having a dual forward and reverse test point circuit arrangement is shown according to the present invention. The amplifier 400 can be substituted for the conventional amplifier 125, 125' within the communication system 100. The amplifier 400, like other amplifiers, includes a first port 402 for receiving a forward signal and for providing an amplified reverse signal, a second port 432 for receiving a reverse signal and for providing an amplified forward signal, diplex filters 414, 424, and gain stages 416, 418. More specifically, the forward signal is received at port 402, passed by the forward section 410 of diplexer 414, amplified by forward gain stage 416, and passed to port 432 by the forward section 420 of diplexer 424. The reverse signal is received at port 432, passed by the reverse section 422 of diplexer 424, amplified by reverse gain stage 418, and passed to port 402 by the reverse section 412 of diplexer 414.

In accordance with the present invention, a dual forward and reverse test point circuit 460 is located in the upstream section of the amplifier 400, between the first port 402 and the first diplex filter 414. The upstream test circuit 460 includes a single directional coupler 404 coupled to both a forward test point 406 and a reverse test point 408. A second, downstream test point circuit 470 is located between the second diplex filter 424 and the second port 432. The downstream test circuit 470 similarly includes a single directional coupler 426 coupled to both a forward test point 430 and a reverse test point 428. In this manner, less loss is introduced into the reverse signal path of the amplifier 400 than is the case for prior art amplifier 125', and thus the gain, noise figure, and distortion of the amplifier's reverse path are only minimally impacted, while the single test point reverse balancing feature is still achieved.

Figure 5:
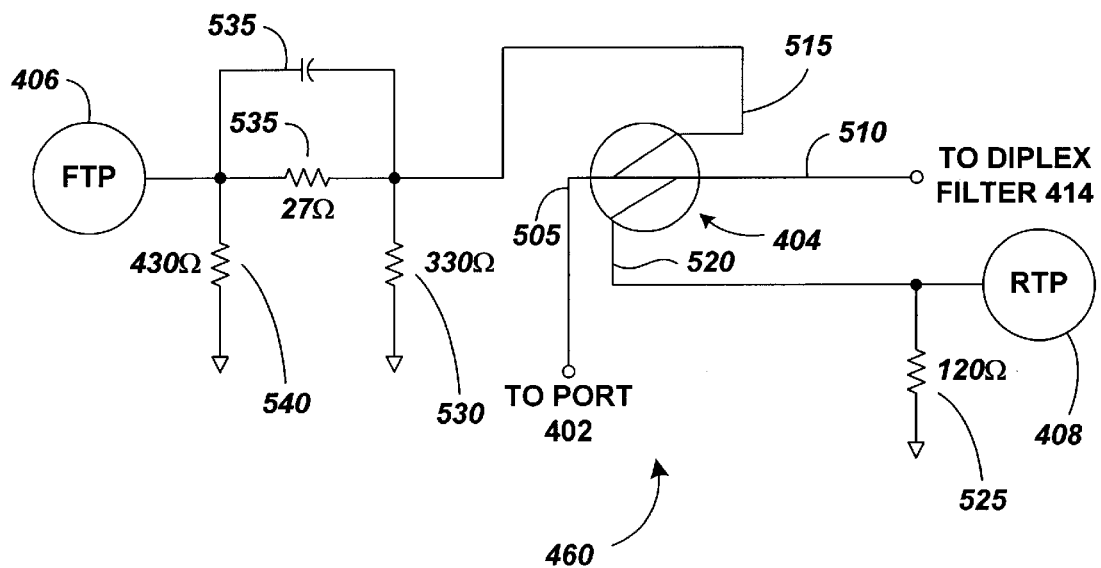
FIG. 5 is an electrical circuit diagram of a circuit for implementing dual forward and reverse test points in the test point circuit arrangement of FIG. 4 in accordance with the present invention.

FIG. 5 is an electrical circuit diagram of a dual forward and reverse test point circuit 460 according to the present invention. As shown, a single directional coupler 404 is employed. The directional coupler 404 can be, for instance, a four port coupler such as a M/A Com EMDC-17-5-75 coupler. The forward input terminal 505 of the directional coupler 404 is coupled to port 402 (FIG. 4) of the amplifier 400, and the reverse input terminal 510 is coupled to the diplex filter 414. The forward sampled output terminal 515 is coupled to the forward test point 406, and the reverse sampled output terminal 520 is coupled to the reverse test point 408. Conventionally, the reverse sampled output terminals of the forward test point directional couplers were terminated.

One major issue with this new approach is that the forward test point response must be realized with a non-ideally terminated reverse sampled output terminal 520. This issue is resolved by locating attenuation circuits at both the forward and reverse sampled output terminals 515, 520 of the directional coupler 404. These circuits provide the required sampled output terminal termination as well as the required attenuation, which is preferably 3 dB for a 17 dB coupler, thereby yielding 20 dB down test points. Since the flatness of the forward test point response requires a precise reverse sampled output terminal termination, a single resistor 525 to ground, which provides 3 dB of insertion loss, can be used as the reverse sampled output terminal termination. The value of the resistor 525 should be reasonably close to 75 ohms, and, in a tested device, a 120-ohm resistor coupled between the reverse sampled output terminal 520 and a ground voltage sufficed.

Since the reverse test point response flatness does not require as ideal of a termination on the forward sampled output terminal as the forward test point requires on the reverse sampled output terminal, a typical PI resistive attenuator pad comprising a first resistor 535 connected between the forward sampled output terminal 515 and the forward test point 406, a second resistor 530 coupled between the forward sampled output terminal 515 and a ground voltage, and a third resistor 540 coupled between the forward test point 406 and the ground voltage can be used as the forward sampled output terminal termination. An optional capacitor 538 can be coupled parallel to the first resistor 535. By way of example, resistor 535 was 27 ohms, resistor 530 was 330 ohms, and resistor 540 was 430 ohms. It will be appreciated that other attenuator arrangements, such as a T resistive attenuator pad, could alternatively be used.

Figure 6:
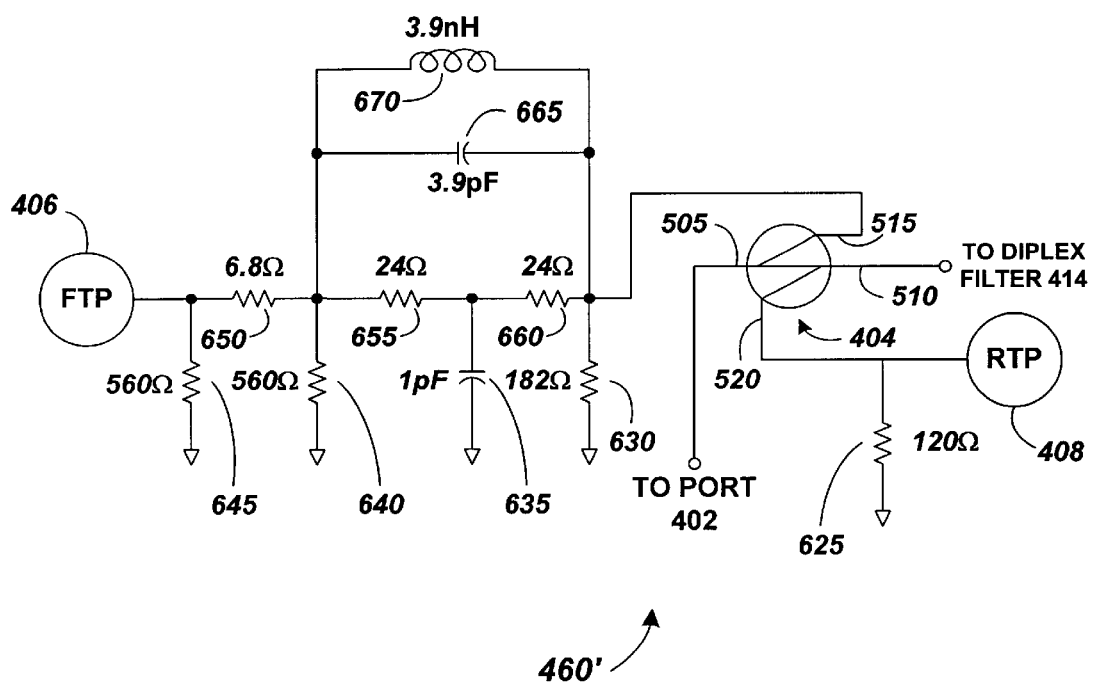
FIG. 6 is an electrical circuit diagram of another circuit for implementing dual forward and reverse test points in the test point circuit arrangement of FIG. 4 in accordance with the present invention.

FIG. 6 is an electrical circuit diagram of an alternative dual forward and reverse test point circuit 460' according to the present invention. As is the case in FIG. 5, a single directional coupler 404, such as a M/A Com EMDC-17-5-75 coupler, is used. The forward input terminal 505 of the directional coupler 404 is coupled to port 402 (FIG. 4) of the amplifier 400, and the reverse input terminal 510 is coupled to the diplex filter 414. The forward sampled output terminal 515 is coupled to the forward test point 406, and the reverse sampled output terminal 520 is coupled to the reverse test point 408.

Similar to the circuit of FIG. 5, attenuation circuits are located at both the forward and reverse sampled output terminals 515, 520 of the directional coupler 404 to provide the required sampled output terminations and attenuation, which is preferably 3 dB using a 17 dB coupler, thereby yielding flat 20 dB down test points. The attenuation circuit located at the reverse sampled output terminal 520, for example, is comprised of a single resistor 625 that provides 3 dB of insertion loss. The resistor 625 is coupled between the reverse output terminal 520 and a ground voltage, and its value should be reasonably close to 75 ohms.

Instead of the PI resistive attenuator pad shown in FIG. 5, the attenuation circuit located at the forward sampled output terminal 515 of FIG. 6 includes a pseudo bridge-T shaping network followed by a PI pad, an arrangement that helps prevent and compensate for tilt and ripples in the test point responses that can occur when non-ideal terminations are present on the input and output through legs 505, 510 of the directional coupler 404. The bridged-T network provides a way to shape and tilt the forward test point response to compensate for any characteristics of the directional coupler 404. The bridged-T network also serves to buffer the coupler 404 from the open circuit equivalent impedance of the PI pad, which provides the necessary attenuation to adjust the forward test point response level. The bridged T Network, in conjunction with resistor 630 that is coupled to ground, provides the necessary forward sampled output termination to ensure a flat reverse sampled output test point response.

More specifically, the bridged T-network comprises three series resistors 650, 655, 660 coupled between the forward test point 406 and the forward output terminal 515. Resistor 630 is coupled between the forward output terminal 515 and a ground voltage. Capacitor 635 is coupled, at a first end, to resistors 655, 660 and, at a second end, to the ground voltage, and resistor 640 is coupled, at a first end, to resistors 650, 655 and, at a second end, to the ground voltage. Resistor 645 is coupled between the forward test point 406 and the ground voltage. Additionally, a parallel inductor-capacitor circuit, comprising inductor 670 and capacitor 655, is coupled, at a first end, to the forward output terminal 515 and, at a second end, to resistors 650, 655.

According to one example circuit that was built and tested, component values are as shown in FIG. 6. It will be appreciated, however, that different values can be chosen to optimize the response for different applications.

In the case of a −20 dB test point, which was achieved using a 17 dB coupler 404 and a 3 dB PI pad, the forward sampled output terminal termination at the reverse test point frequencies changed from approximately 220 ohms (with the circuit 460 of FIG. 5) to approximately 50 ohms (with the circuit 460' of FIG. 6), thereby reducing reverse sampled output test point response ripple from 0.7 dB to 0.2 dB. These measurements were made with loads of approximately −16 dB return loss presented to the directional coupler 404 input and output through legs.

In summary, the dual forward and reverse test point circuit is suitable for use in any device, such as an amplifier, that processes both forward and reverse signals. The dual forward and reverse test point circuit as described above includes a single directional coupler with four ports: a first for receiving the forward signal, a second for receiving the reverse signal, a third for coupling to the forward test point, and a fourth for coupling to the reverse test point. As a result, fewer components are used in the amplifier to provide the same number of test points as in prior art devices. Furthermore, an amplifier using the test point circuit and location of the present invention provides single test point reverse path balancing with no degradation of reverse path gain, noise figure, or distortion performance, all of which are degraded by the location and number of test points in prior art amplifiers.

What is claimed is:

1. A dual forward and reverse test point circuit, comprising:
   a single directional coupler having first, second, third, and fourth ports, wherein the first port receives a forward signal input and provides a reverse signal output, and wherein the second port receives a reverse signal input and provides a forward signal output;
   a reverse test point connected to the fourth port;
   a first attenuator connected to the reverse test point and the fourth port;
   a forward test point coupled to the third port; and
   a second attenuator connected between the forward test point and the third port, wherein the second attenuator comprises a bridged-T network and a PI resistive network.

2. The dual forward and reverse test point circuit of claim 1, wherein:
   the first attenuator comprises a resistor having first and second ends, the first end connected to the reverse test point and the fourth port, and the second end coupled to a ground voltage.

3. The dual forward and reverse test point circuit of claim 2, wherein the second attenuator comprises:
   first, second, third resistors, fourth, fifth, and sixth resistors; the first resistor having a first end directly connected to the third port and having a second end connected to a first end of the second resistor; the second resistor having a second end connected to a first end of the third resistor; the third resistor having a second end directly connected to the forward test point; the fourth resistor having a first end connected to the third port and having a second end connected to the ground voltage; the fifth resistor having a first end connected to the second end of the second resistor and having a second end connected to the ground voltage; and the sixth resistor having a first end connected to the forward test point and having a second end connected to the ground voltage; and
   a first capacitor having a first end connected to the second end of the first resistor and having a second end connected to the ground voltage.

4. The dual forward and reverse test point circuit of claim 3, wherein the second attenuator further comprises:
   a second capacitor having a first end connected to the third port and having a second end connected to the second end of the second resistor; and
   an inductor having a first end connected to the first end of the second capacitor and having a second end connected to the second end of the second capacitor.

5. An electronic device for processing both forward and reverse signals in a communication system, the electronic device comprising:
   an electrical path along which both the forward and reverse signals flow; and
   a test circuit located on the electrical path, comprising:
      a forward test point coupled to the forward signal;
      a reverse test point coupled to the reverse signal; and
      a single directional coupler connected to the electrical path for coupling the forward signal to the forward test point and for coupling the reverse signal to the reverse test point, wherein termination circuitry coupled between the forward test point and the single direction coupler comprises a bridged-T network and a PI resistive network.

6. The electronic device of claim 5, further comprising:

a port for receiving the forward signal and for outputting the reverse signal; and a diplex filter for passing the forward signal and blocking the reverse signal, wherein the test circuit is coupled between the port and the diplex filter.

7. The electrical device of claim 5, further comprising:

a port for receiving the reverse signal and for outputting the forward signal; and a diplex filter for passing the reverse signal and blocking the forward signal, wherein the test circuit is coupled between the port and the diplex filter.

8. The electrical device of claim 5, further comprising:

a first port for receiving the forward signal and for outputting the reverse signal;

a first diplex filter for passing the forward signal and blocking the reverse signal, wherein the test circuit is coupled between the first port and the first diplex filter;

a second electrical path along which both the forward and reverse signals flow;

a second test circuit located on the second electrical path, comprising:
    a forward test point coupled to the forward signal;
    a reverse test point coupled to the reverse signal; and
    a single directional coupler connected to the electrical path for coupling the forward signal to the forward test point and for coupling the reverse signal to the reverse test point;

a second port for receiving the reverse signal and for outputting the forward signal; and a second diplex filter for passing the reverse signal and blocking the forward signal, wherein the second test circuit is coupled between the second port and the second diplex filter.

9. The electronic device of claim 5, wherein the electrical device comprises an amplifier.

10. An amplifier for a communication system that transmits both forward and reverse signals, the amplifier comprising:

a first port for receiving a forward signal and for outputting a reverse signal;

a second port for outputting the forward signal and for receiving the reverse signal;

a first diplex filter coupled to the first port for filtering signals at the first port to provide the forward signal to a first gain stage such that the forward signal is amplified prior to proceeding to the second port;

a second diplex filter coupled to the second port for filtering signals at the second port to provide the reverse signal to a second gain stage such that the reverse signal is amplified prior to proceeding to the first port; and a test circuit located on an electrical path within the amplifier, the electrical path providing both the forward signal and the reverse signal, the test circuit comprising:
    a forward test point coupled to the forward signal;
    a reverse test point coupled to the reverse signal; and
    a single directional coupler connected to the electrical path for coupling the forward signal to the forward test point and for coupling the reverse signal to the reverse test point, wherein termination circuitry coupled between the forward test point and the single directional coupler comprises a bridged-T network and a PI resistive network.

11. The amplifier of claim 10, wherein:

the test circuit is connected between the first port and the first diplex filter;

the forward test point provides access to the forward signal prior to its amplification; and the reverse test point provides access to the reverse signal subsequent to its amplification.

12. The amplifier of claim 10, wherein:

the test circuit is connected between the second port and the second diplex filter;

the forward test point provides access to the forward signal subsequent to its amplification; and the reverse test point provides access to the reverse signal prior to its amplification.

* * * * *